United States Patent [19]

Kishi

[11] Patent Number: 5,047,705
[45] Date of Patent: Sep. 10, 1991

[54] DIGITAL AMPLITUDE MODULATION APPARATUS

[75] Inventor: Takahiko Kishi, Tokyo, Japan

[73] Assignee: Kabushiki Kaisha Kenwood, Tokyo, Japan

[21] Appl. No.: 533,852

[22] Filed: Jun. 6, 1990

[30] Foreign Application Priority Data
Jun. 8, 1989 [JP] Japan ................... 1-146479

[51] Int. Cl.$^5$ .......................... H03C 1/52; H03C 1/60
[52] U.S. Cl. .................................. 332/151; 332/167; 332/170; 375/41; 375/43; 375/61
[58] Field of Search ............... 332/115, 149, 151, 167, 332/168, 169, 170, 171; 375/41, 43, 61

[56] References Cited

U.S. PATENT DOCUMENTS 4,003,002  1/1977  Snijders et al. ................... 375/61 X
4,974,236  11/1990  Gurcan et al. ................... 332/170 X Primary Examiner—Siegfried H. Grimm
Attorney, Agent, or Firm—Sixbey, Friedman, Leedom & Ferguson

[57] ABSTRACT

A digital amplitude modulation apparatus for amplitude-modulating a digital carrier having a frequency fc by a digital modulating wave associated with a sampling frequency fs1, at a sampling frequency fs2, wherein the conditions $m \times fs1 = fs2$, and $fc = n/4 \times fs2$ are satisfied, where m is a positive integer (2,4,6, ...) and n is a positive integer (1,3,5, ...). A fold distortion relative to an original digital amplitude modulated wave is not generated even if a fold component elimination filter is not used.

4 Claims, 4 Drawing Sheets

5,047,705

DIGITAL AMPLITUDE MODULATION APPARATUS

BACKGROUND OF THE INVENTION

1. Field of the Invention

The present invention relates to a digital amplitude modulation apparatus, and more particularly to a digital amplitude modulation apparatus which uses different sampling frequencies between an analog modulating wave and a digital amplitude modulated wave.

2. Related Background Art

A digital amplitude modulation apparatus has been proposed heretofore, which digitally processes amplitude modulation such as AM, DSB and SSB.

FIG. 5 is a block diagram showing a conventional digital amplitude modulation apparatus.

An analog modulating wave $S_A$ is supplied to an A/D converter 10, sampled in response to a clock CK1 (sampling frequency fs1) supplied from a timing generator 12, and converted into a digital modulating wave $S_D$.

The digital modulating wave $S_D$ is supplied to a fold component elimination filter 14 to eliminate a fold component thereof. The filter operates in response to a clock CK2 (sampling frequency fs2) supplied from another timing generator 16.

The digital modulating wave $S_D$, outputted from the fold compensation filter 14 is therefore associated with the sampling frequency fs2 (fs1 < fs2).

The digital modulating wave $S_D'$ is inputted to an amplitude modulator 18 operating at clock CK2 (sampling frequency fs2), and multiplied by a digital carrier wave having a frequency fc to obtain a digital DSB modulated wave $H_D$ associated with the carrier wave frequency fc.

This digital DSB modulated wave $H_D$ is D-A converted into an analog DSB modulated wave $H_A$ by a D/A converter 20 which operates at clock CK2 (sampling frequency).

The reason why the sampling frequency fs1 lower than fs2 for the digital DSB modulated wave $H_D$ is used by the A/D converter 10 is as follows.

In order to make it easy to eliminate the fold component of an A/D converted digital modulating signal, or to prevent generating an image signal during frequency conversion at the succeeding stage, it is preferable that the sampling frequency fs2 for the digital amplitude modulated wave HD is as high as possible.

If there is used a high sampling frequency fs1 for obtaining a digital modulating wave $S_D$, a high speed A/D converter must be used resulting in a very high cost of the apparatus.

From the above reasons, the sampling frequency fs2 is made high, whereas the sampling frequency fs1 is made low.

Apart from the above, as shown in FIG. 6A, the spectrum of a digital modulating wave $S_D$ sampled at the sampling frequency fs1 includes not only the original signal component A within the Nyquist bandwidth from 0 to $(\frac{1}{2}) \times fs1$ but also a fold component B, for example, within the bandwidth from $(\frac{1}{2}) \times fs1$ to $3/2 \times fs1$. Therefore, if DSB modulation is digitally carried out without removing the fold component B, the fold distortion appears in the spectrum of the digital DSB modulated wave $H_D$ at the sampling frequency fs2 as shown in FIG. 6B, wherein both side band waves A1 and A2 derived from amplitude modulation of signal A and both side band waves B1 and B2 derived from amplitude modulation of signal B are partially superposed one upon another.

It is therefore necessary to eliminate the fold component of the digital modulating wave $S_D$ prior to amplitude modulation, so that there is provided the fold component elimination filter 14 at the output of the A/D converter 10 in order to eliminate the fold component B.

The spectrum of the digital modulating wave $S_D'$ outputted from the fold component elimination filter 14 becomes as shown in FIG. 7A, and the spectrum of the digital DSB modulated wave $H_D$ becomes as shown in FIG. 7B. Therefore, there are present only both side band waves A1 and A2 derived from the DSB modulated original signal within the Nyquist bandwidth.

With the above-described conventional technique, it is necessary to provide the fold component elimination filter 14 of complicated structure between the A/D converter 10 and amplitude modulator 18, resulting in a large burden on configuring the apparatus.

SUMMARY OF THE INVENTION

The present invention has been made in consideration of the above problems, and seeks to provide a digital amplitude modulation apparatus having a simplified structure.

It is another object of the present invention to provide a digital SSB modulation apparatus having a simplified structure.

According to an aspect of the present invention, there is provided a digital amplitude modulation apparatus for amplitude-modulating a digital carrier having a frequency fc by a digital modulating wave associated with a sampling frequency fs1, at a sampling frequency fs2, wherein the conditions $2 \times fs1 = fs2$, and $fc = (n/4) \times fs2$ are satisfied, where n is a positive integer (1, 3, 5, ...).

According to another aspect of the present invention, there is provided a digital amplitude modulation apparatus, wherein the condition $m \times fs1 = fs2$ is satisfied, where m is a positive integer (4, 6, 8, ...).

According to a still further aspect of the present invention, there is provided a digital amplitude modulation apparatus comprising Hilbert converter means for converting said digital modulating wave associated with said sampling frequency fs1 into first and second digital modulating waves at said sampling frequency fs1 each having a phase difference of 90 degrees; carrier generator means for generating first and second digital carriers in association with said sampling frequency fs2 each having said carrier frequency fc and a phase difference of 90 degrees; first multiplier means for multiplying said first digital modulating wave by said first digital carrier to output a first digital multiplication signal associated with said sampling frequency fs2; second multiplier means for multiplying said second digital modulating wave by said second digital carrier to output a second digital multiplication signal associated with said sampling frequency fs2; and adder (subtracter) means for adding (subtracting) said first digital multiplication signal to (by) said second digital multiplication signal to output a digital SSB modulated wave associated with said sampling frequency fs2.

DETAILED DESCRIPTION OF THE PREFERRED EMBODIMENTS

Figure 1:
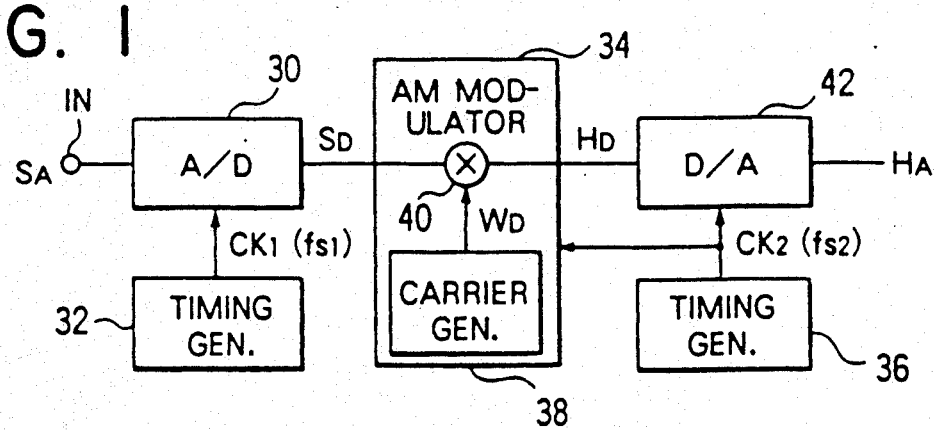
FIG. 1 is a block diagram showing a first embodiment of the digital DSB modulation apparatus according to the present invention.

The first embodiment of this invention will be described with reference to the block diagram of FIG. 1 showing the digital DSB modulation apparatus.

An analog modulating wave $S_A$ inputted from an input terminal IN is supplied to an A/D converter 30, sampled in response to a clock CK1 (sampling frequency fs1) supplied from a timing generator 32, and converted into a digital modulating wave $S_D$.

The digital modulating wave $S_D$ is supplied to an amplitude modulator 34, and digitally DSB-modulated to obtain a digital DSB modulated wave $H_D$ in response to a clock CK2 (sampling frequency fs2).

The amplitude modulator is constructed of a carrier generator 38 and a multiplier 40. The carrier generator 38 generates a digital carrier $W_D$ having a frequency fc in response to clock CK2 (sampling frequency fs2) supplied from another timing generator 36. The multiplier 40 digitally multiplies the digital modulating wave $S_D$ by the digital carrier $W_D$ in response to clock CK2 (sampling frequency fs2). Therefore, there is outputted from the multiplier 40 the digital DSB modulated wave $H_D$.

In the above arrangement, it is assumed that $2 \times fs1 = fs2$, and $fc = \frac{1}{4} \times fs2$. Therefore, the digital carrier $W_D$ sampled at the time interval of $T = 1/fs2$ cyclically takes values 0, +p, 0, -p in this order.

Assuming that the clocks CK1 and CK2 are synchronized with each other, the multiplier 40 outputs at time $t = t0$ a value, multiplied by +p, of the digital modulating wave $S_D$ sampled at time $t = t0$, at time $t1 = t0 + T$ a value 0, at time $t2 = t0 + 2T$ a value, multiplied by $-p$, of the digital modulating wave $S_D$ sampled at that time, at time $t3 = t0 + 3T$ a value 0, and at time $t4 = t0 + 4T$ a value obtained by carrying out the similar operation as at time $t = t0$. Such operation continue thereafter. In this manner, the multiplication is carried out as if the digital modulating wave $S_D$ has been sampled at the sampling frequency fs2. Therefore, it is not necessary to carry out at the preceding stage of the multiplier 40 a particular digital processing required for making the sampling frequency fs1 of the digital modulating wave $S_D$ match the sampling frequency fs2.

There is connected at the output side of the amplitude modulator 34 a D/A converter 42 by which the digital DSB modulated wave $H_D$ is converted into an analog DSB modulated wave $H_A$ in response to clock CK2.

Figure 2A:
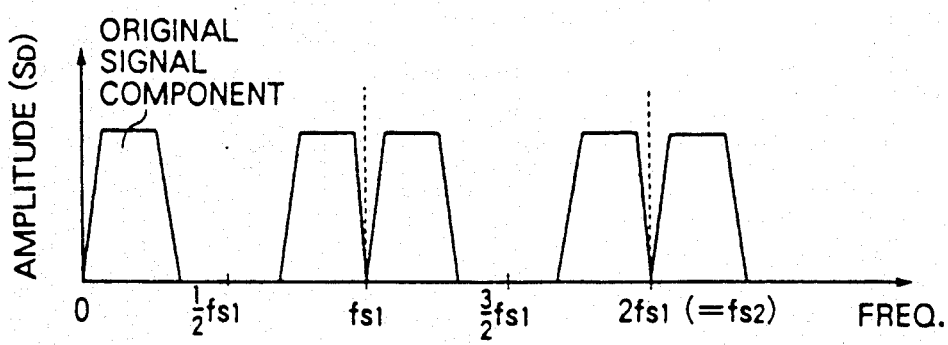
FIGS. 2A to 2C are frequency spectrum diagrams used for explaining the operation of the apparatus shown in FIG. 1.

The operation of the embodiment will be described with reference to FIG. 2A.

The analog modulating wave $S_A$ is converted by the A/D converter 30 into a digital modulating wave $S_D$ at the sampling frequency of fs1.

Figure 2B:
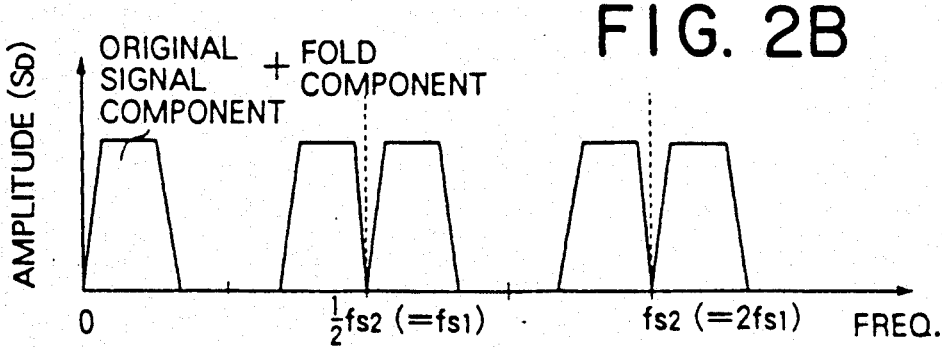
Figure 2C:
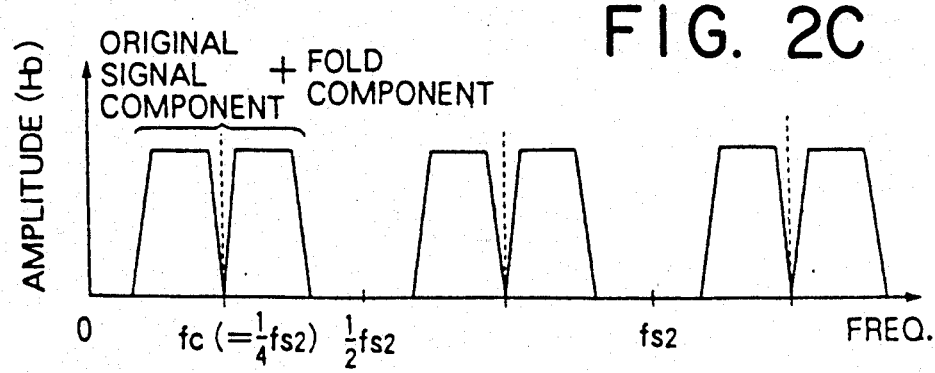

The digital modulating wave $S_D$ is processed by the multiplier 40 of the amplitude modulator 34 as if the wave $S_D$ has been obtained at the sampling frequency fs2. The fold component spectrum is superposed upon the original signal component spectrum at the same amplitude and same phase, so that there is no fold distortion (refer to FIG. 2B). The digital carrier $W_D$ to be multiplied by the digital modulating wave $S_D$ has the frequency fc equal to $\frac{1}{4} \times fs2$. Therefore, the spectrum of the digital DSB modulated wave $H_D$ outputted from the multiplier 40 in association with the sampling frequency fs2 becomes as shown in FIG. 2C. In this case also, the fold component spectrum is superposed upon the original signal component spectrum at the same amplitude and same phase, without generating fold distortion.

It is therefore unnecessary to provide a fold component elimination filter between the A/D converter 30 and amplitude modulator 34.

The digital DSB modulated wave $H_D$ outputted from the amplitude modulator 34 is converted by the D/A converter 42 into an analog DSB modulated wave $H_A$ which is then outputted to the succeeding stage.

According to this embodiment, the sampling frequencies fs1 and fs2 for the digital modulating wave $S_D$ and digital DSB modulated wave HD has a relationship of $2 \times fs1 = fs2$, and the carrier frequency fc of the digital carrier $W_D$ and the sampling frequency fs2 is related by $fc = (\frac{1}{4}) \times fs2$. As a result, the fold component spectrum of the digital DSB modulated wave $H_D$ is superposed upon the original signal spectrum at the same amplitude and same phase without fold distortion, so that a fold component elimination filter is not necessary to be provided between the A/D converter 30 and amplitude modulator 34, thus simplifying the structure.

Also for the case where the carrier frequency fc of the digital carrier $W_D$ and the sampling frequency fs2 is related by $fc = (n/4) \times fs2$ ($n = 3, 5, 6, \ldots$). The fold component spectrum of the digital DSB modulated wave $H_D$ is superposed upon the original signal spectrum at the same amplitude and same phase without fold distortion.

Also for the case where the sampling frequencies fs1 and fs2 are related by $m \times fs1 = fs2$ ($m = 4, 6, 8, \ldots$), although the fold component spectrum of the digital DSB modulated wave $H_D$ is formed within the Nyquist bandwidth, this fold component is superposed upon the original signal component spectrum at the same amplitude and phase without fold distortion, and the original signal component can be picked up easily from the analog DSB modulated wave $H_A$ by using an analog IF filter or the like. It is therefore unnecessary to provide a fold component elimination filter between the A/D converter 30 and amplitude modulator 34.

Figure 3:
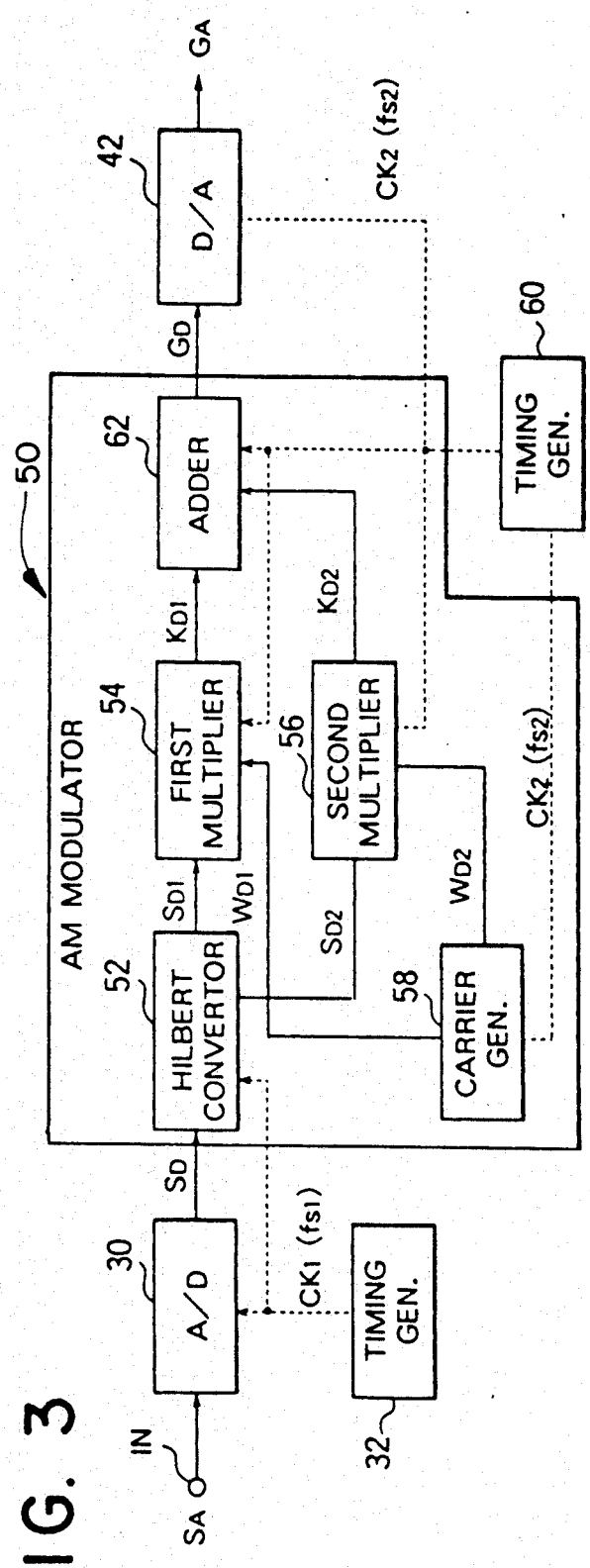
FIG. 3 is a block diagram showing a second embodiment of the digital SSB modulation apparatus according to the present invention.

The second embodiment of this invention will be described with reference to the block diagram of FIG. 3 showing a digital SSB modulation apparatus.

An analog modulating wave $S_A$ inputted from an input terminal IN is supplied to an A/D converter 30, sampled in response to a clock CK1 (sampling frequency fs1) supplied from a timing generator 32, and converted into a digital modulating wave $S_D$.

The digital modulating wave $S_D$ is supplied to an amplitude modulator 50, and digitally SSB-modulated to obtain a digital SSB modulated wave $G_D$ in response to a clock CK2 (sampling frequency fs2).

In the amplitude modulator 50, there is connected to the output side of the A/D converter 30 a Hilbert converter 52 which Hilbert-converts the digital modulating wave $S_D$ in response to clock CK1 sampling frequency fs1 and generates first and second digital modulating waves $S_{D1}$ and $S_{D2}$ each having a phase difference of 90 degrees.

The first digital modulating wave $S_{D1}$ from the Hilbert converter 52 is inputted to a first multiplier 54, and the second digital modulating wave $S_{D2}$ is inputted to a second multiplier 56.

The amplitude modulator 50 is provided with a carrier generator 58 which generates, in response to a clock CK2 (sampling frequency fs2) supplied from another timing generator 60, first and second digital carriers $W_{D1}$ and $W_{D2}$ each having the frequency of fc and a phase difference of 90 degrees. The first and second digital carriers $W_{D1}$ and $W_{D2}$ are supplied to the first and second multipliers 54 and 56, respectively.

The first multiplier 54 multiplies the first digital modulating wave $S_{D1}$ by the first digital carrier $W_{D1}$ in response to clock CK2 (sampling frequency fs2) to output a first digital multiplication signal $K_{S1}$.

The second multiplier 54 multiplies the second digital modulating wave $S_{D2}$ by the second digital carrier $W_{D2}$ in response to clock CK2 (sampling frequency fs2) to output a second digital multiplication signal $K_{S2}$.

In the above arrangement, it is assumed that $2 \times fs1 = fs2$, and $fc = (\frac{1}{4}) \times fs2$. Therefore, the first digital carrier $W_{D1}$ sampled at the time interval of $T = 1/fs2$ cyclically takes values 0, +p, 0, −p in this order, and the second digital carrier $W_{D2}$, values of +p, 0, −p, 0 in this order.

Assuming that the clocks CK1 and CK2 are synchronized with each other and that the sample timings for the first and second digital carriers $S_{D1}$ and $S_{D2}$ from the Hilbert converter 52 are set to be shifted by $(\frac{1}{2}) \times T$, the first multiplier 54 outputs at time $t = t0$ a value, multiplied by +p, of the first digital modulating wave $S_{D1}$ sampled at time $t = t0$, at time $t1 = t0 + T$ a value 0, at time frequency fs1 of the first digital modulating wave $S_{D1}$ modulating wave $S_{D1}$ sampled at that time, at time $t3 = t0 + 3T$ a value 0, and at time $t4 = t0 + 4T$ a value obtained by carrying out the similar operation as at time $t = t0$. Such operations continue thereafter. In this manner, the multiplication is carried out as if the first digital modulating wave $S_{D1}$ has been sampled at the sampling frequency fs2. Therefore, it is not necessary to carry out at the preceding stage of the first multiplier 54 a particular digital processing required for making the sampling frequency fs1 of the first digital modulating wave $S_{D1}$ match the sampling frequency fs2.

The second multiplier 56 outputs at time $t = t0$ a value 0, at time t1 a value, multipled by −p, of the second digital modulating wave $S_{D2}$ sampled at time $t = t1$, at time t2 a value 0, at time t3 a value, multiplied by +p, of the second digital modulating wave $S_{D2}$ sampled at that time, at time t4 a value obtained by carrying out the similar operation as at time $t = t0$. Such operations continue thereafter. In this manner, the multiplication is carried out as if the second digital modulating wave $S_{D2}$ has been sampled at the sampling frequency fs2. Therefore, it is not necessary to carry out at the preceding stage of the second multiplier 56 a particular digital processing required for making the sampling frequency fs1 of the first digital modulating wave $S_{D2}$ match the sampling frequency fs2.

There is connected at the output sides of the first and second multipliers 54 and 56 an adder 62 operating in response to clock CK2 (sampling frequency fs2) and adding the first and second digital multiplication signals $K_{D1}$ and $K_{D2}$ together to obtain a digital SSB modulated wave $G_D$.

There is connected to the output side of the amplitude modulator 50 a D/A converter 42 by which the digital SSB modulated wave $G_D$ is converted into an analog SSB modulated wave $G_A$ in response to clock CK2.

Figure 4:
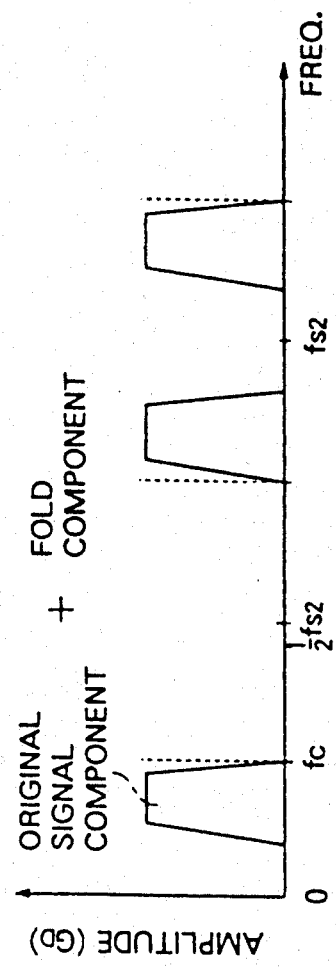
FIG. 4 is a frequency spectrum diagram used for explaining the operation of the apparatus shown in FIG. 3.
Figure 5:
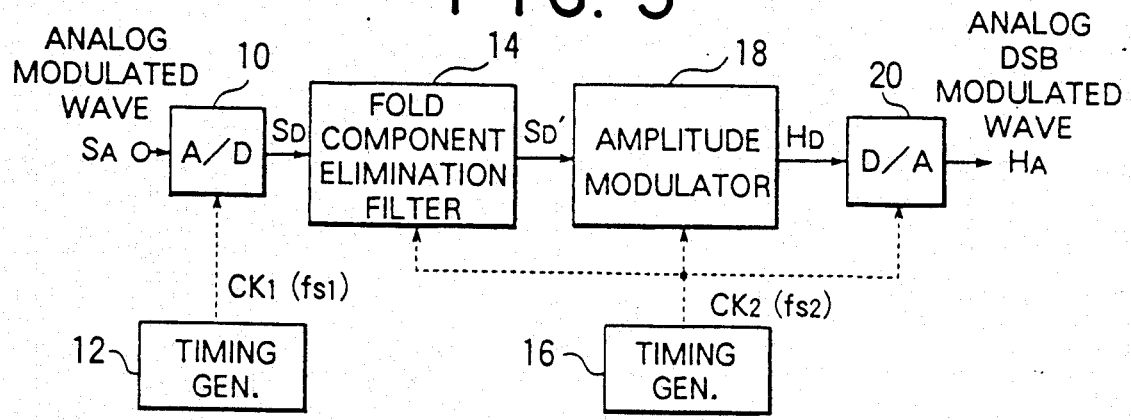
FIG. 5 is a block diagram showing a conventional digital DSB modulation apparatus.
Figure 6A:
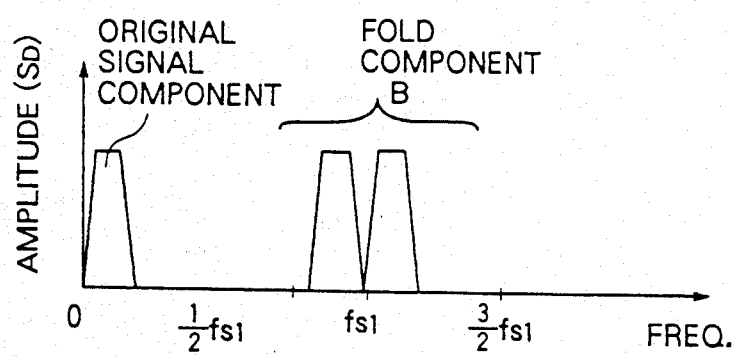
FIGS. 6A and 6B, and 7A and 7B are frequency spectrum diagrams used for explaining the operation of the apparatus shown in FIG. 5.
Figure 6B:
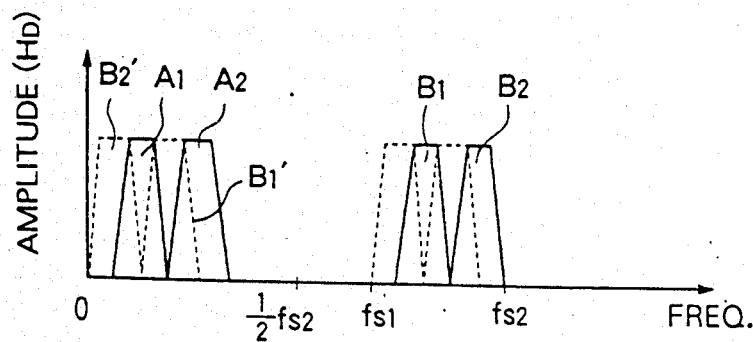
Figure 7A:
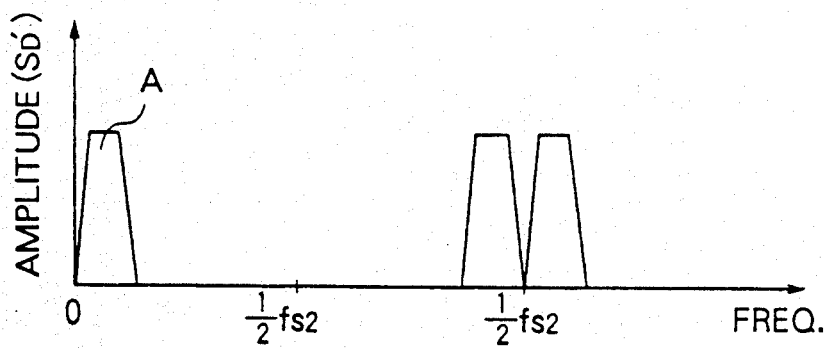
Figure 7B:
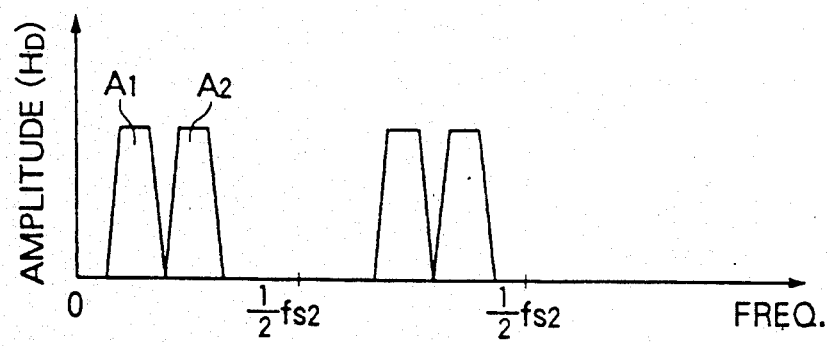

The operation of the embodiment will be described with reference to FIG. 4.

The analog modulating wave $S_A$ is converted by the A/D converter 30 into a digital modulating wave $S_D$ at the sampling frequency of fs1 and inputted to the amplitude modulator 50.

The digital modulating wave $S_D$ is converted at the Hilbert converter 52 in the amplitude modulator 50 into the first and second digital modulating waves $S_{D1}$ and $S_{D2}$ associated with the sampling frequency of fs1 and each having a phase difference of 90 degrees and a sample timing shifted by $(\frac{1}{2}) \times T$.

The first and second digital modulating waves $S_{D1}$ and $S_{D2}$ are processed by the first and second multipliers as if they have been obtained at the sampling frequency fs2. The fold component spectrum is superposed upon the original signal component spectrum at the same amplitude and same phase, so that there is no fold distortion (refer to FIGS. 2A and 2B).

The first and second digital carriers $W_{D1}$ and $W_{D2}$ to be multiplied by the first and second digital modulating waves $S_{D1}$ and $S_{D2}$ have the frequency fc equal to $(\frac{1}{4}) \times fs2$. Therefore, the spectrum of the digital SSB modulated wave $G_D$ outputted from the adder 63 in association with the sampling frequency fs2 becomes as shown in FIG. 4. In this case also, the fold component spectrum is superposed upon the original signal component spectrum at the same amplitude and same phase, without generating fold distortion.

It is therefore unnecessary to provide a fold component elimination filter between the A/D converter 30 and amplitude modulator 50.

The digital SSB modulated wave $G_D$ outputted from the amplitude modulator 50 is converted by the D/A converter 42 into an analog SSB modulated wave $G_A$ which is then outputted to the succeeding stage.

According to this embodiment, the sampling frequencies fs1 and fs2 for the digital modulating wave $S_D$ and digital SSB modulated wave $G_D$ has a relationship of $2 \times fs1 = fs2$, and the carrier frequency fc of the first and second digital carriers $W_{D1}$ and $W_{D2}$ and the sampling frequency fs2 is related by $fc = (\frac{1}{4}) \times fs2$. As a result, the fold component spectrum of the digital SSB modulated wave $G_D$ is superposed upon the original signal spectrum at the same amplitude and same phase without fold distortion, so that a fold component elimination filter is not necessary to be provided between the A/D converter 30 and amplitude modulator 50, and that the quatizing error of the coefficient of the Hilbert converter 52 can be made small because of a low operating speed thereof.

Also for the case where the carrier frequency fc of the digital carrier $W_D$ and the sampling frequency fs2 is related by $fc = (n/4) \times fs2$ ($n = 3, 5, 6, \ldots$), the fold component spectrum of the digital SSB modulated wave $G_D$ is superposed upon the original signal spectrum at the same amplitude and same phase without fold distortion.

Also for the case where the sampling frequencies fs1 and fs2 is related by $m \times fs1 = fs2$ ($m = 4, 6, 8, \ldots$), the fold component is superposed upon the original signal component spectrum at the same amplitude and phase without fold distortion, so that it is not necessary to provide a fold component elimination filter between the A/D converter 30 and amplitude modulator 50.

Instead of the adder shown in FIG. 3, a subtractor may be used for realizing a digital SSB modulation apparatus.

In the above embodiments, digital DSB and SSB modulations have been described byway of example. The invention may also applied to other digital amplitude modulations.

According to a digital amplitude modulation apparatus of this invention, the sampling frequency fs1 for a digital modulating wave and the sampling frequency fs2 for the digital amplitude modulated wave are related by $2 \times fs1 = fs2$, the carrier frequency fc an sampling frequency fs2 are related by $fc = (n/4) \times fs2$, wherein n is 1, 3, 5, . . . Accordingly, a fold distortion relative to an original digital amplitude modulated wave is not generated even if a fold component elimination filter is not used, and the structure of the apparatus can be simplified.

Further, in place of the condition of $2 \times fs1 = fs2$ between the sampling frequency fs1 for a digital modulating wave and the sampling frequency fs2 for the digital amplitude modulated wave, the condition of $m \times fs1 = fs2$ maybe used, where m is 4, 6, 8, . . . With this arrangement, a fold distortion can be prevented from being generated in an original signal.

Furthermore, a digital amplitude modulation apparatus of this invention includes Hilbert converter means for converting said digital modulating wave associated with said sampling frequency fs1 into first and second digital modulating waves at said sampling frequency fs1 each having a phase difference of 90 degrees; carrier generator means for generating first and second digital carriers in association with said sampling frequency fs2 each having said carrier frequency fc and a phase difference of 90 degrees; first multiplier means for multiplying said first digital modulating wave by said first digital carrier to output a first digital multiplication signal associated with said sampling frequency fs2; second multiplier means for multiplying said second digital modulating wave by said second digital carrier to output a second digital multiplication signal associated with said sampling frequency fs2; and adder (subtractor) means for adding (subtracting) said first digital multiplication signal to (by) said second digital multiplication signal to output a digital SSB modulated wave associated with said sampling frequency fs2. It is possible therefore to realize a digital SSB modulation apparatus without using a fold components elimination filter, while making small the quantizing error of the Hilber converter means because of a low operating frequency thereof.

Although the present invention has been fully described in connect with the preferred embodiments thereof with reference to the accompanying drawings, it will be apparent to those skilled in the art that various changes and modifications of the present invention are possible within the scope of the following claims.

What is claimed is:

1. A digital amplitude modulation apparatus comprising:
   means (30, 32) for generating a series of digital modulation signals ($S_D$) in a rate of $f_{s1}$; and
   means (34, 36, 50) for digitally amplitude-modulating said digital modulating signal ($S_D$) with a digital carrier ($W_D$) of a rate of $f_c$ in a processing rate of $f_{s2}$ to produce a digital amplitude-modulated signal ($G_D$),
   wherein the equations $2 \times f_{s1} = f_{s2}$ and $f_c = (n/4) \times f_{s2}$ are satisfied, where n is a positive odd number (1, 3, 5, . . .).

2. A digital amplitude modulation apparatus according to claim 1, wherein said amplitude-modulating means comprises means (38) for generating a digital carrier ($W_D$) of a rate $f_c$ at said processing rate ($f_{s2}$) and means (40) for digitally multiplying the digital modulation signal ($S_D$) with the digital carrier ($W_D$).

3. A digital amplitude modulation apparatus according to claim 1, wherein the equation $m \times f_{s1} = f_{s2}$ is satisfied, where m is a positive even number (4, 6, 8, . . .).

4. A digital amplitude modulation apparatus according to claim 1, wherein said amplitude-modulating means comprises:
   Hilbert converter means (52) for converting said digital modulation signal ($S_D$) into first and second digital modulation signals ($S_{D1}$ and $S_{D2}$) at said rate of $f_{s1}$, the first and second signals having a phase difference of 90 degrees relative to each other;
   carrier generator means (58) for generating first and second digital carriers ($W_{D1}$ and $W_{D2}$) of a rate of $f_c$ at the processing rate $f_{s2}$, the first and second carriers having a phase difference of 90 degrees relative to each other;
   first multiplier means (54) for multiplying said first digital modulation signal by said first digital carrier to output a first digital multiplication signal ($K_{D1}$) at said processing rate $f_{s2}$;
   second multiplier means (56) for multiplying said second digital modulation signal by said second digital carrier to output a second digital multiplication signal ($K_{D2}$) at said rate of $f_{s2}$; and
   adder means (62) for adding said first digital multiplication signal to said second digital multiplication signal to output a digital SSB modulated wave at said rate of $f_{s2}$.

* * * * *